(12) United States Patent
Fornara

(10) Patent No.: US 11,906,332 B2
(45) Date of Patent: Feb. 20, 2024

(54) MOS TRANSISTOR ISOLATED FROM THE SUBSTRATE OF AN INTEGRATED CIRCUIT AND APPLICATION FOR DETECTING AN OPENING OF A CLOSED CONTAINER

(71) Applicant: STMicroelectronics (Rousset) SAS, Rousset (FR)

(72) Inventor: Pascal Fornara, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 208 days.

(21) Appl. No.: 17/504,021

(22) Filed: Oct. 18, 2021

(65) Prior Publication Data

US 2022/0120589 A1 Apr. 21, 2022

(30) Foreign Application Priority Data

Oct. 19, 2020 (FR) ...................... 2010681

(51) Int. Cl.
*G01D 5/24* (2006.01)
*H01L 27/06* (2006.01)
(Continued)

(52) U.S. Cl.
CPC ........... *G01D 5/24* (2013.01); *H01L 27/0629* (2013.01); *H01L 28/60* (2013.01);
(Continued)

(58) Field of Classification Search
CPC ........ G01R 27/00; G01R 27/02; G01R 27/26; G01R 27/2605; G01D 5/00; G01D 5/12; G01D 5/14; G01D 5/24; H01L 22/00; H01L 22/30; H01L 22/34; H01L 27/00; H01L 27/02; H01L 27/04; H01L 27/06; H01L 27/0611; H01L 27/0617; H01L 27/0629; H01L 27/08; H01L 27/085; H01L 27/088; H01L 27/092; H01L 27/12; H01L 27/1203; H01L 27/1207; H01L 28/00; H01L 28/40;
(Continued)

(56) References Cited

U.S. PATENT DOCUMENTS 5,111,260 A 5/1992 Malhi et al.
5,712,496 A 1/1998 Takahashi et al.
(Continued)

FOREIGN PATENT DOCUMENTS

| FR | 3091786 A1 | 7/2017 | |
|---|---|---|---|
| JP | 2012055048 A | * 3/2012 | ................ H02J 7/00 |
| WO | 2020099747 A1 | 5/2020 | |

OTHER PUBLICATIONS

INPI Search Report and Written Opinion for FR 2010681 dated Jun. 15, 2021 (8 pages).

*Primary Examiner* — Hoai-An D. Nguyen
(74) *Attorney, Agent, or Firm* — Crowe & Dunlevy

(57) ABSTRACT

An integrated circuit includes a first substrate. A MOS transistor has a first polysilicon region electrically isolated from the first substrate and including a gate region. A second polysilicon region is electrically isolated from the first polysilicon region and from the first substrate. The second polysilicon region includes a source region, a substrate region and a drain region of the MOS transistor. The first polysilicon region is located between an area of the first substrate and the second polysilicon region.

23 Claims, 11 Drawing Sheets

(51) Int. Cl.
*H01L 29/66* (2006.01)
*H01L 29/786* (2006.01)
*H01L 21/28* (2006.01)
*H01L 49/02* (2006.01)

(52) U.S. Cl.
CPC .. *H01L 29/40114* (2019.08); *H01L 29/66765* (2013.01); *H01L 29/78678* (2013.01)

(58) Field of Classification Search
CPC ......... H01L 28/60; H01L 29/00; H01L 29/02; H01L 29/06; H01L 29/08; H01L 29/0843; H01L 29/0847; H01L 29/40; H01L 29/401; H01L 29/4011; H01L 29/40114; H01L 29/41; H01L 29/423; H01L 29/42312; H01L 29/66; H01L 29/66007; H01L 29/66075; H01L 29/66227; H01L 29/66409; H01L 29/66477; H01L 29/66742; H01L 29/6675; H01L 29/66765; H01L 29/68; H01L 29/76; H01L 29/772; H01L 29/78; H01L 29/786; H01L 29/78651; H01L 29/7866; H01L 29/78672; H01L 29/78678

See application file for complete search history.

(56) References Cited

U.S. PATENT DOCUMENTS

| | | | | |
|---|---|---|---|---|
| 7,502,261 | B2* | 3/2009 | Harari | H01L 29/40114 365/185.11 |
| 9,653,164 | B2* | 5/2017 | Hong | H01L 29/40114 |
| 2008/0070363 | A1* | 3/2008 | Mokhlesi | H10B 69/00 438/257 |

\* cited by examiner

MOS TRANSISTOR ISOLATED FROM THE SUBSTRATE OF AN INTEGRATED CIRCUIT AND APPLICATION FOR DETECTING AN OPENING OF A CLOSED CONTAINER

PRIORITY CLAIM

This application claims the priority benefit of French Application for Patent No. 2010681, filed on Oct. 19, 2020, the content of which is hereby incorporated by reference in its entirety to the maximum extent allowable by law.

TECHNICAL FIELD

Embodiments and implementations relate to microelectronics and, in particular, to MOS transistors isolated from the substrate of an integrated circuit, but also to the detection of an opening of a closed container containing, for example, a valuable product, for example a perfume bottle, or a bottle of wine.

BACKGROUND

Certain applications require integrated circuits that include MOS transistors electrically isolated from the substrate of the integrated circuit.

There is thus a need to propose such MOS transistors that have a structure that is simple to produce, and that are in particular compatible with conventional CMOS manufacturing methods using, in particular, two polysilicon levels but that are also compatible with non-volatile memory cell manufacturing methods having select transistors with a gate buried in the substrate.

SUMMARY

According to one aspect, a system comprises an integrated circuit including: a first substrate and at least one first MOS transistor.

This first MOS transistor has: a first polysilicon region electrically isolated from the first substrate and including a gate region; a second polysilicon region electrically isolated from the first polysilicon region and from the first substrate, said second polysilicon region including a source region, a substrate region and a drain region of said first transistor; the first polysilicon region being located between an area of the first substrate and the second polysilicon region.

Thus, such a transistor includes two polysilicon regions, making it compatible with conventional CMOS manufacturing methods using two polysilicon levels.

The gate region of the transistor is incorporated into the first polysilicon region (the first polysilicon level) which is located between the substrate of the integrated circuit (referred to as the "first substrate") and the second polysilicon region (the second polysilicon level).

Moreover, it is in this second polysilicon region, electrically isolated from the first region, and located above this first polysilicon region, that the source and drain regions of the first transistor as well as the substrate region of this first transistor are located.

Thus, even if the first polysilicon region is heavily doped, for example as a result of a conventional manufacturing method using in-situ doping of the first polysilicon level, this does not interfere with the operation of the first transistor since the active source and drain regions and the channel region (contained in the substrate region of the transistor), are located in the second polysilicon region not in this first polysilicon region.

According to one embodiment, the substrate region of the first transistor is advantageously less heavily doped than the first polysilicon region.

This reduces or even eliminates leakages between the source and drain regions of the first transistor.

For information, and by example, the substrate region of the first transistor can comprise intrinsic polysilicon, i.e., having a doping of less than $10^{15}$ atoms/cm$^3$ or a dopant concentration of less than $10^{17}$ atoms/cm$^3$, for example in the order of $5 \times 10^{16}$ atoms/cm$^3$.

The first polysilicon region can have a dopant concentration of greater than $10^{19}$ atoms/cm$^3$, which can correspond to the in situ doping typically used in some double-polysilicon CMOS methods.

The doping of the substrate region of the first transistor can also be used to advantageously adjust the threshold voltage of this first transistor.

This first transistor can be either a PMOS transistor or an NMOS transistor.

According to a first alternative embodiment, the integrated circuit can comprise an isolation trench, for example of the shallow trench type (STI: Shallow Trench Isolation), located in the first substrate of the integrated circuit and the first polysilicon region can thus be located above (and supported by) this isolation trench.

According to one embodiment compatible with this first alternative embodiment, the first polysilicon region can protrude from the second polysilicon region in the direction of the source-drain of the first transistor.

Moreover, in this source-drain direction, the second polysilicon region rests on the first polysilicon region via a first dielectric region which can include, for example, a gate oxide flanked by a silicon oxide-silicon nitride-silicon oxide stack.

According to this embodiment, the gate contact can thus advantageously be made on the protruding part of the first polysilicon region.

According to another embodiment, also compatible with this first alternative embodiment, the first polysilicon region protrudes from the second polysilicon region in a direction perpendicular to the source-drain direction of the first transistor.

Furthermore, in the source-drain direction of the first transistor, the dimension of the second polysilicon region is greater than the dimension of the first polysilicon region and the second polysilicon region rests on the first polysilicon region as well as on the isolation trench via a second dielectric region, for example also of the silicon oxide-silicon nitride-silicon oxide type.

This embodiment thus procures a more compact structure wherein the gate contact can thus be made on the part of the first polysilicon region protruding from the second polysilicon region in the direction perpendicular to the source-drain direction.

According to yet another embodiment, also compatible with this first alternative embodiment, the first polysilicon region protrudes from the second polysilicon region in a direction perpendicular to the source-drain direction of the first transistor.

Furthermore, in the source-drain direction of the first transistor, the dimension of the second polysilicon region is greater than the dimension of the first polysilicon region and the second polysilicon region rests on the first polysilicon region via a third dielectric region, for example a gate oxide, and further rests on the isolation trench.

In such a structure, there is no need to use a silicon oxide-silicon nitride-silicon oxide stack, while maintaining a compact structure.

According to a second alternative embodiment, the integrated circuit can comprise an isolation trench located in the first substrate, for example a trench of the shallow trench type again, and a dielectric layer surrounding the first polysilicon region.

This first polysilicon region surrounded by the dielectric layer thereof extends through the isolation trench into the first substrate of the integrated circuit.

The substrate region of the first transistor rests at least partially on one end of the first polysilicon region surrounded by said dielectric layer and the source and drain regions rest on the isolation trench.

In this second alternative embodiment, the first polysilicon region isolated from the first substrate of the integrated circuit is thus a buried region, which makes such an alternative embodiment compatible with the methods of manufacturing non-volatile select transistor memories having a buried gate.

Thus, when the integrated circuit comprises at least one non-volatile memory cell of the select transistor type having a gate buried in the first substrate, the first polysilicon region can have a shape similar to that of the buried gate of said select transistor.

According to another embodiment, the integrated circuit comprises: a dielectric layer disposed between the first polysilicon region and the first substrate (of the integrated circuit), and a second MOS transistor including, in the first substrate, a source region, a drain region and a substrate region of the second transistor located between the source and drain regions and covered by said dielectric layer.

The first polysilicon region thus includes a gate region common to the first transistor and to the second transistor.

This embodiment provides a particularly compact two-transistor structure, wherein one of the transistors is isolated from the first substrate of the integrated circuit and the other transistor is produced in this first substrate.

The second transistor can be an NMOS transistor or a PMOS transistor.

As seen hereinabove, the first transistor can also be an NMOS transistor or a PMOS transistor.

Moreover, when the first transistor is an NMOS transistor and the second transistor is a PMOS transistor, or when the first transistor is a PMOS transistor and the second transistor is an NMOS transistor, two complementary transistors (CMOS transistors) are obtained, which are particularly compact and compatible with conventional CMOS transistor manufacturing methods.

According to another aspect, a method for manufacturing an MOS transistor within an integrated circuit having a first substrate comprises: forming a first polysilicon region electrically isolated from the first substrate; forming a second polysilicon region electrically isolated from the first polysilicon region and from the first substrate, the first polysilicon region being located between an area of the first substrate and the second polysilicon region; forming, within the second polysilicon region, a source region and a drain region located on either side of a substrate region of the transistor; forming at least one source contact area on the source region and at least one drain contact area on the drain region; and forming at least one gate contact area on the first polysilicon region.

According to one implementation, the method comprises an in situ doping of the first polysilicon region.

According to one implementation, the method comprises an absence of doping of the substrate region or a doping of the substrate region that is weaker than the in situ doping of the first polysilicon region.

According to one implementation, the method comprises forming an isolation trench in the first substrate and forming the first polysilicon region above said isolation trench.

According to one implementation, the first polysilicon region can be formed simultaneously with the production of non-volatile memory select transistor gates buried in the first substrate.

According to another possible implementation, the first polysilicon region is formed simultaneously with the formation of the floating gate of a dual-gate state transistor of a non-volatile memory cell.

According to one implementation, the second polysilicon region can be formed simultaneously with the formation of the gate of a low-voltage transistor.

The transistor can be a PMOS or NMOS transistor.

Such a double-polysilicon MOS transistor with the gate in the first level can advantageously be used to detect an opening of a container, as will be explained in more detail hereinbelow.

Currently, in order to determine whether a product is fit for use or for sale, it is becoming increasingly necessary to determine whether the container containing the product has not been opened, for example with a view to replacing the original product with a counterfeit product or a product of lower quality.

A visual inspection of the container is no longer sufficient.

Use of an electrically conductive wire connecting two output terminals of an integrated circuit has thus been proposed in order to detect a non-opening or an opening of the container respectively corresponding to a non-severing or a severing of said wire.

More specifically, the integrated circuit will compare the voltages present at the two output terminals in order to deduce whether or not said wire has been severed.

However, it appears that if the wire, once severed, has been repaired, for example by means of welding or an electrically conductive glue, the comparison of the voltages at the two output terminals of the integrated circuit will again correspond to a non-opening of the container, when in fact the container could actually have been opened.

There is thus also a need to be able to detect not only a current severing of the wire, but also a past severing of the wire followed by a repair thereof, for example using a conductive glue or a welding spot, which could thus be synonymous, for example, with an attempt to open or an opening of a container provided with this wire with repair of this wire after said opening.

The use of a first transistor as defined hereinabove, having a double polysilicon level with the gate in the first level and isolated from the substrate of the integrated circuit, solves this problem.

More specifically, according to one embodiment, the first transistor is, for example, a PMOS transistor, the source region whereof is connected to the ground and having a threshold voltage such that it is on when a zero voltage is applied to the gate thereof and off in the presence of a bias, for example a negative bias, of the gate thereof.

The first PMOS transistor is thus a so-called "normally on" transistor, which term is well-known to a person skilled in the art.

Thus, a system can be proposed that comprises: a closed container; the integrated circuit as defined hereinabove and including this "normally on" PMOS transistor.

The integrated circuit has a first terminal and a second terminal connected by an electrically conductive wire having a severable part and arranged to be severed at the severable part thereof in the event of an opening or attempted opening of the container.

The system further includes a detection device configured to detect a severing of the severable part, the detection device including, within the integrated circuit: a first capacitor electrically isolated from the first substrate of the integrated circuit and connected to the first terminal of the integrated circuit; the first PMOS transistor mentioned hereinabove, whose gate is connected to the second terminal of the integrated circuit and whose source is connected to the ground; a second capacitor electrically isolated from the first substrate of the integrated circuit and having a first electrode connected to the drain of the first PMOS transistor; and a measuring circuit configured to measure the voltage of said first electrode.

Moreover, a voltage of said first electrode that is lower than a threshold is thus representative of a present or past severing of said severable part of the wire.

However, such a system allowing for the detection of a present or past severing of the severable part of the wire is not limited to the use of this particular first PMOS transistor.

Indeed, in a more general manner, a first MOS transistor whose source and drain regions are electrically isolated from the first substrate (of the integrated circuit) can be used, the gate region whereof being connected to the second terminal of the integrated circuit and configured to be in an on-state in the presence of a zero voltage applied to the gate thereof and in an off-state in the presence of a non-zero bias of the gate region thereof.

Thus, in a more general manner, a system comprises: a closed container; an integrated circuit having a first substrate and a first and a second terminals connected by an electrically conductive wire having a severable part and arranged to be severed at the severable part thereof in the event of an opening or attempted opening of the container; and a detection device configured to detect a severing of the severable part, the detection device including, within the integrated circuit; a first capacitor electrically isolated from the first substrate of the integrated circuit and connected to the first terminal; a first MOS transistor whose source and drain regions are electrically isolated from the first substrate, the gate region whereof being connected to the second terminal and configured to be in an on-state in the presence of a zero voltage applied to the gate thereof and in an off-state in the presence of a non-zero bias of the gate region thereof; a second capacitor electrically isolated from the first substrate of the integrated circuit and having a first electrode connected to the drain of the first PMOS transistor; and a measuring circuit configured to measure the voltage of said first electrode, a voltage of said first electrode that is lower than a threshold being representative of a present or past severing of said severable part.

The first MOS transistor can be an MOS transistor as defined hereinabove (whose gate is in the first polysilicon region and whose source, substrate and drain regions are in the second polysilicon region), or it can be another transistor having another structure that isolates it from the first substrate of the integrated circuit.

According to one embodiment, the first capacitor and the second capacitor are capacitors that include two polysilicon electrodes separated by a dielectric and resting on an isolating region of the integrated circuit.

Contactless passive transponders, in particular NFC ("Near Field Communication") transponders, for example tags, are well known to a person skilled in the art.

It is of particular interest to use them to detect an opening or an attempted opening, by an ill-intentioned third party, of the closed container containing, for example, a valuable product, for example a perfume bottle.

Near Field Communication (NFC) is a wireless connectivity technology that enables communication over a short distance, for example 10 cm, between electronic devices, such as contactless integrated circuit cards or labels for example, and readers.

In a more general manner, NFC technology is standardized by the NFC Forum consortium.

NFC technology is particularly suitable for connecting any type of user device and enables fast and easy communications.

A contactless transponder is a transponder that is capable of exchanging information via an antenna with a contactless reader, according to a contactless communication protocol.

An NFC transponder, which is a contactless transponder, is a transponder that is compatible with NFC technology.

NFC technology is an open technological platform standardized according to the ISO/IEC 18092 and ISO/IEC 21481 standards, but which incorporates many existing standards such as, for example, type A and type B protocols defined in standard ISO-14443 which can be communication protocols that can be used in NFC technology.

Contactless technology can also be used in RFID (Radio Frequency IDentification) transponders compatible with standards ISO 15693 and ISO 18000-3.

When transmitting information between a reader and a passive transponder, the reader generates a magnetic field via the antenna thereof, which is generally, according to the standards conventionally used, a sine wave (the carrier) at 13.56 MHz.

In order to transmit information from the reader to the transponder, the reader uses an amplitude modulation of said carrier.

The transponder demodulates the carrier received in order to derive therefrom the data transmitted from the reader.

In order to transmit information from the transponder to the reader, the reader generates the magnetic field (the carrier) without modulation. The antenna of the transponder then modulates the field generated by the reader according to the information to be transmitted. The frequency of this modulation corresponds to a subcarrier of said carrier. The frequency of this subcarrier depends on the communication protocol used and can be, for example, equal to 848 kHz.

This modulation is carried out by changing the load connected to the terminals of the antenna of the transponder.

In other words, the transponder retro-modulates the wave originating from the reader to transmit information and does not integrate, for the transmission of information, actual transmission means, or a transmitter, capable for example of generating its own magnetic field during the transmission. Such a transponder devoid of any transmitter is referred to as a passive transponder, as opposed to an active transponder which includes a transmitter.

Generally a passive transponder is devoid of any power supply since it uses the wave originating from the reader to power the integrated circuit thereof.

As mentioned hereinabove, information is transmitted from the passive transponder to the reader by load modulation.

More specifically, by changing the load at the terminals of the antenna of the transponder, the output impedance of the antenna of the reader changes due to the magnetic coupling between the two antennas.

This load change carried out during the load modulation results in an amplitude and/or phase modulation of the signal (voltage or current) at the antenna of the reader. A copy of the antenna current is generated and injected into the receive chain of the reader, where it is demodulated and processed to extract the information transmitted.

According to one embodiment, the said system further comprises a contactless passive transponder configured to communicate with a reader via an antenna using a carrier signal, the transponder including the integrated circuit further having two antenna terminals connected to the antenna.

The integrated circuit further includes a comparison circuit configured to compare the voltage of said first electrode of the second capacitor with said threshold, and processing circuit configured to: command a charging of the first capacitor in response to a first command from the reader; command a charging of the second capacitor in response to a second command from the reader; activate the measuring circuit in response to an activation command from the reader, and communicate the result of said comparison to the reader in response to a read command from the reader.

According to another aspect, a method for detecting whether or not the severable part of the electrically conductive wire of the system as defined hereinabove is or has previously been severed comprises: charging the first capacitor; charging the second capacitor; at least one measuring of the voltage of the first electrode of the second capacitor; and analyzing the result of a comparison between said measured voltage and said threshold.

According to one implementation, the method can comprise, in order to monitor the non-severing of the wire, and when the two capacitors have been charged only once: taking a plurality of measurements of the voltage of the first electrode at distant measuring times; and producing a plurality of comparisons between these measured voltages and said threshold; wherein a measured voltage that is below said threshold at a measurement time indicating a severable part that was severed at said measurement time or before this measurement time.

BRIEF DESCRIPTION OF THE DRAWINGS

Other advantages and features will become apparent upon examining the detailed description of non-limiting embodiments and implementations of the invention, and from the accompanying drawings in which.

DETAILED DESCRIPTION

Figure 1:
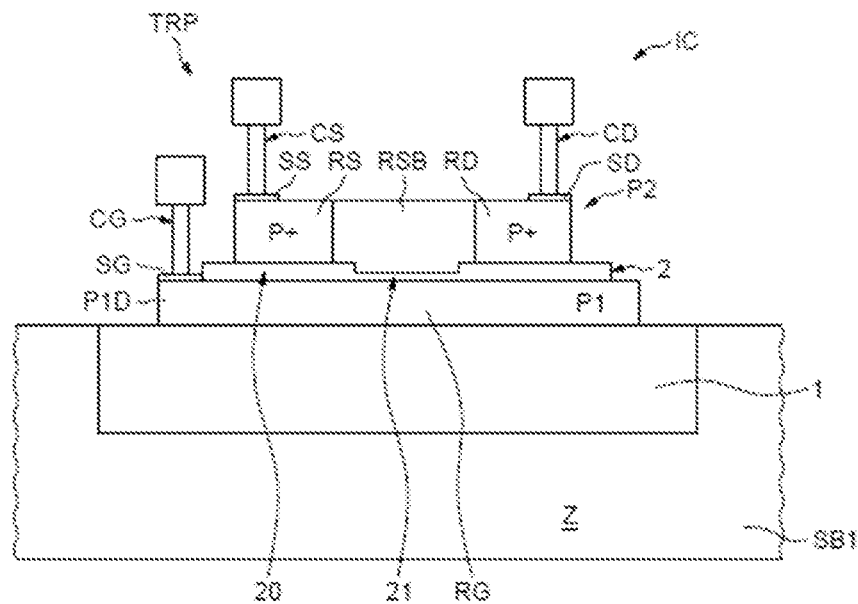
FIGS. 1-7 illustrate cross-sectional views of transistor embodiments.

In FIG. 1, the reference IC is used to denote an integrated circuit including a substrate SB1, referred to hereinafter as the "first substrate" so as to distinguish it from the substrate region RSB of the first transistor TRP, the structure of which will now be described.

This first transistor TRP, which in this case is a PMOS transistor, has a first polysilicon region P1 resting on the insulating material of a shallow trench-type isolation trench 1 made in the first substrate SB1.

This first polysilicon region P1 is thus electrically isolated from the first substrate SB1.

This first polysilicon region P1 includes a gate region RG of the first transistor TRP.

The first transistor TRP further comprises a second polysilicon region P2 electrically isolated from the first polysilicon region P1 via a first dielectric region 2 on which it rests.

In this example, the first dielectric region 2 includes a gate oxide 21 flanked by two dielectric stacks 20 each including, for example, a silicon oxide-silicon nitride-silicon oxide (ONO) stack.

Since this second polysilicon region P2 is electrically isolated from the first polysilicon region P1, and since this first polysilicon region P1 is electrically isolated from the first substrate SB1, the second polysilicon region P2 is also electrically isolated from the first substrate SB1.

The second polysilicon region P2 includes a source region RS, a substrate region RSB and a drain region RD of the first transistor TRP.

Thus, as shown in FIG. 1, the first polysilicon region P1 is located between an area Z of the first substrate SB1 and the second polysilicon region P2.

In this example embodiment, the first polysilicon region P1 protrudes from (i.e., beyond) the second polysilicon region P2 in the source-drain direction of the first transistor and the second polysilicon region rests, as stated hereinabove, on the first polysilicon region via the first dielectric region 2.

The protruding part P1D of the first polysilicon region P1 allows a silicided area SG of gate contact intended to receive a contact CG of a conventional and known structure, to be produced on the surface thereof.

The first polysilicon region P1 can be doped fairly heavily, for example with a dopant concentration greater than or equal to $10^{19}$ atoms/cm$^3$.

The substrate region of the first transistor is less heavily doped than the first polysilicon region P1.

Thus, this substrate region RSB (vertical to the gate oxide 21) can comprise intrinsic polysilicon, i.e., polysilicon with a dopant concentration of less than or equal to $10^{15}$ atoms/cm$^3$. It could also be doped with a dopant concentration of less than $10^{17}$ atoms/cm$^3$ while, of course, remaining lower than the dopant concentration of the first polysilicon region P1.

The doping of the substrate region RSB allows the threshold voltage of the first transistor TRP to be adjusted.

In this example, since the first transistor TRP is a PMOS transistor, the source RS and drain RD regions are P+ doped (and are vertical to the gate oxides 20).

Moreover, in a conventional and known manner, the source region RS includes, on the top surface thereof, a silicided source contact area SS intended to receive a source contact CS having a conventional structure.

The drain region RD includes, on the top surface thereof, a silicided drain contact area SD intended to receive a drain contact CD having a conventional structure.

Figure 2:
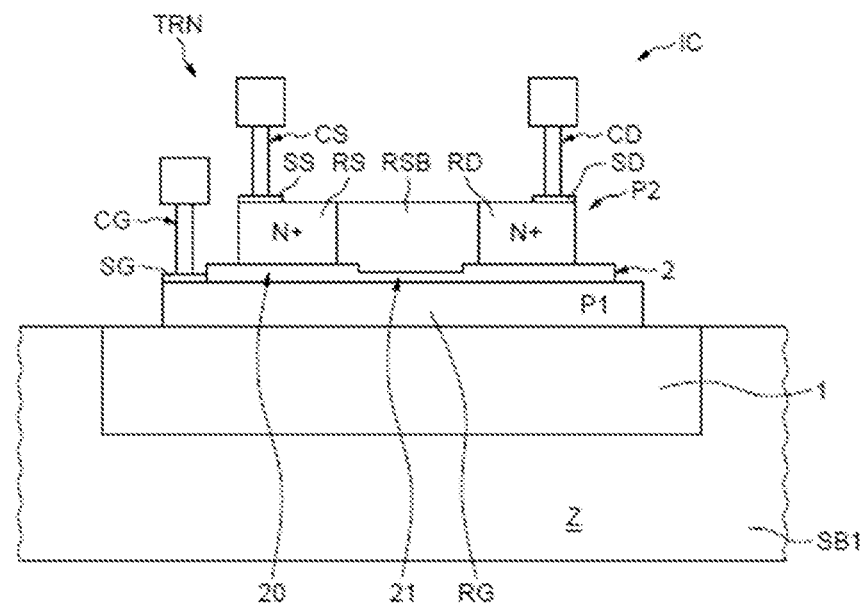

A first transistor TRN shown in FIG. 2 differs simply from the first transistor TRP in FIG. 1 in that the transistor TRN is an NMOS transistor with, in this case, the source RS and drain RD regions being N+ doped.

Figure 3:
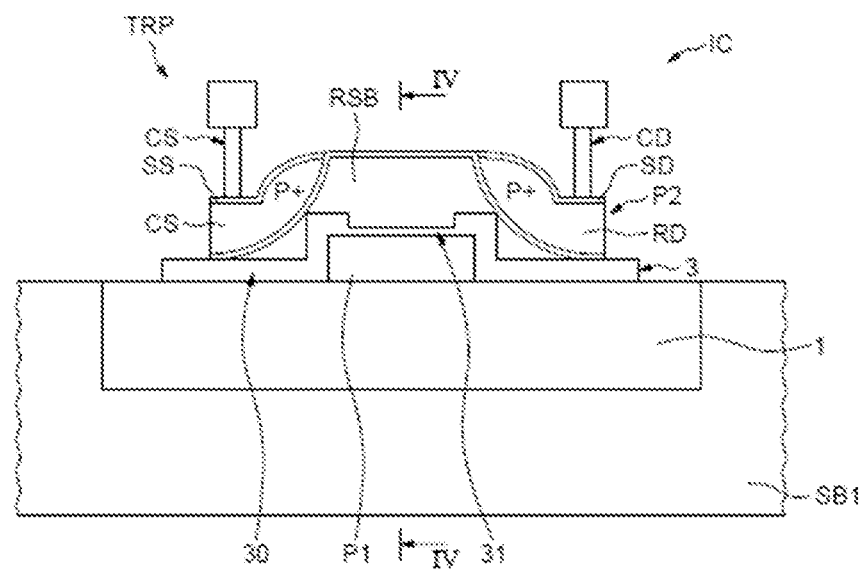
Figure 4:
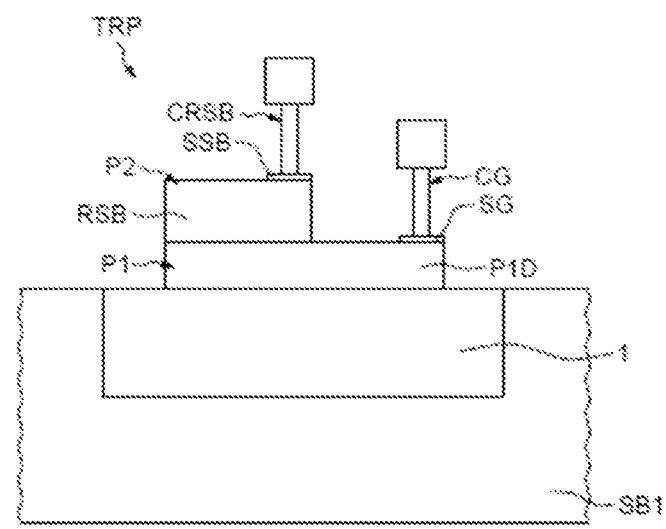

FIG. 3 and FIG. 4 (which is a section along line IV-IV in FIG. 3) diagrammatically show another embodiment of a first transistor TRP which again is a PMOS transistor, with it being understood that it could also be an NMOS transistor depending on the type of doping of the source and drain regions thereof.

In the embodiment shown in FIG. 3, the dimension of the second polysilicon region P2 is shown in this case to be larger, in the source-drain direction, than the dimension of the first polysilicon region P1.

In this case, the second polysilicon region P2 rests on the first polysilicon region and on the isolation trench 1 via a second dielectric region 3. This second dielectric region includes, similarly to the first dielectric region 2, a silicon oxide-silicon nitride-silicon oxide stack 30 and a gate oxide 31.

The source and drain regions rest on the isolating region via the stacks 30, whereas the substrate region RSB rests partially on the first polysilicon region 1 via the gate oxide 31.

Moreover, as shown in FIG. 4, the first polysilicon region P1 in this case protrudes (i.e., extends) from the second polysilicon region P2 in a direction perpendicular to the source-drain direction of the first transistor.

Moreover, the silicided gate contact area SG intended to receive the gate contact CG is again located on this protruding part P1D.

The substrate region RSB further includes, on the top surface thereof, a silicided substrate contact area SSB intended to receive a substrate contact CRSB.

It should be noted that, in FIGS. 1 and 2, this substrate contact is not shown for simplification purposes.

Figure 5:
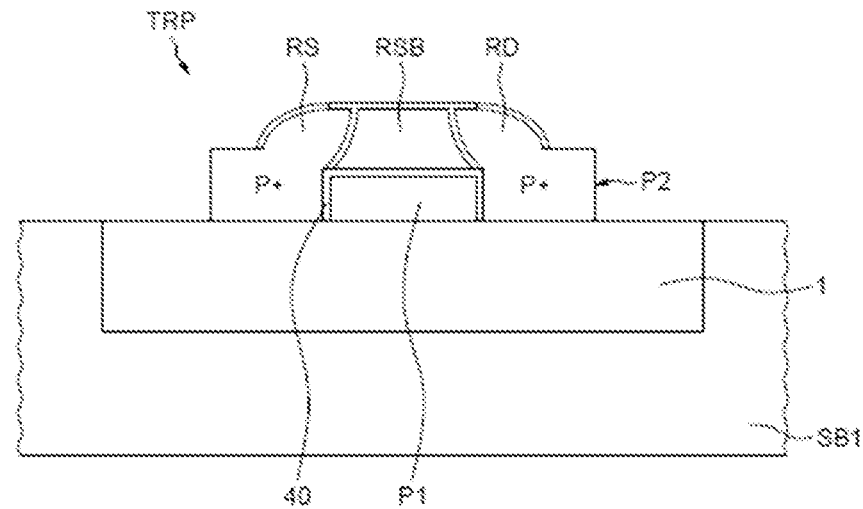

The transistor TRP in FIG. 5 differs from the transistor TRP in FIG. 3 in that the silicon oxide-silicon nitride-silicon oxide stack 30 has been removed.

Moreover, in this embodiment, the second polysilicon region P2 rests on the first polysilicon region P1 via a third dielectric region 40, which in this case is a gate oxide, and also rests directly on the isolation trench 1 at the source RS and drain RD regions.

Moreover, the first polysilicon region P1 protrudes (i.e., extends) from the second polysilicon region P2 in a direction perpendicular to the source-drain direction of the first transistor in a manner similar to that shown in FIG. 4.

Figure 6:
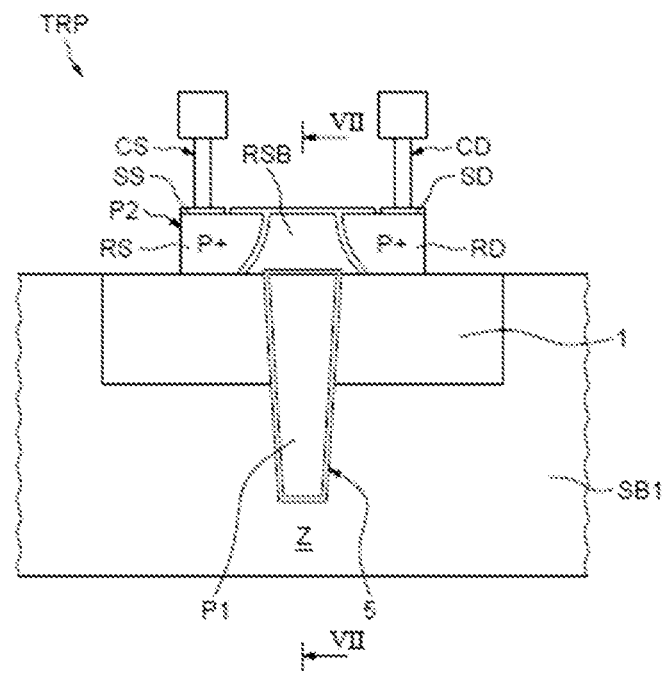
Figure 7:
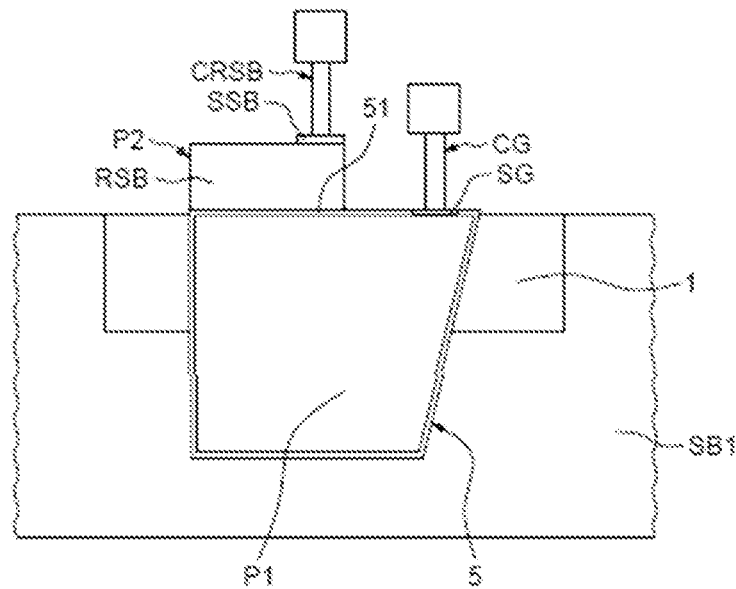

Reference is now made more particularly to FIGS. 6 and 7, which show another alternative embodiment of a first MOS transistor, which again is a PMOS transistor, with it being understood that it could also be an NMOS transistor depending on the type of doping of the source and drain regions thereof.

Again, the integrated circuit IC includes an isolation trench 1 located in the first substrate SB1.

In this alternative embodiment, the first polysilicon region P1 is surrounded by a dielectric layer 5, for example silicon dioxide.

Moreover, the first polysilicon region P1 surrounded by the dielectric layer 5 thereof extends through the isolation trench 5 into the first substrate SB1.

Furthermore, the second polysilicon region P2 still includes the source region RS, the drain region RD and the substrate region RSB located between the source region RS and the drain region RD.

The substrate region RSB of the transistor TRP rests at least partially on an end 51 of the first polysilicon region surrounded by the dielectric layer 5, whereas the source RS and drain RD regions rest on the isolation trench 1.

Thus, also in this alternative embodiment, the first polysilicon region P1 is located between an area Z of the first substrate and the second polysilicon region P2.

The second polysilicon region is again electrically isolated from the first polysilicon region and also electrically isolated from the first substrate SB1.

As shown in FIG. 7, which is a section along line VII-VII in FIG. 6, the first polysilicon region P1 surrounded by the dielectric layer 5 thereof protrudes (i.e., extends) from the second polysilicon region P2 in a direction perpendicular to the drain-source direction, which allows, as described with reference to FIG. 4, at the gate contact CG, contact to be made with the silicided area SG.

This alternative embodiment is thus compatible with a method for manufacturing non-volatile memory cells of the type having a select transistor with a gate buried in the first substrate SB1.

More specifically, the first buried polysilicon region can be produced simultaneously with the production of the buried gates of the select transistors of these memories.

Moreover, the first polysilicon region thus has, for example, a shape similar to that of the buried gate of such a select transistor.

In practice, the first MOS transistor comprises, on the top surface of the second polysilicon region P2, a protective layer intended to protect the underlying part of the second polysilicon region P2 during the silicidation step to obtain the silicided areas.

Figure 8:
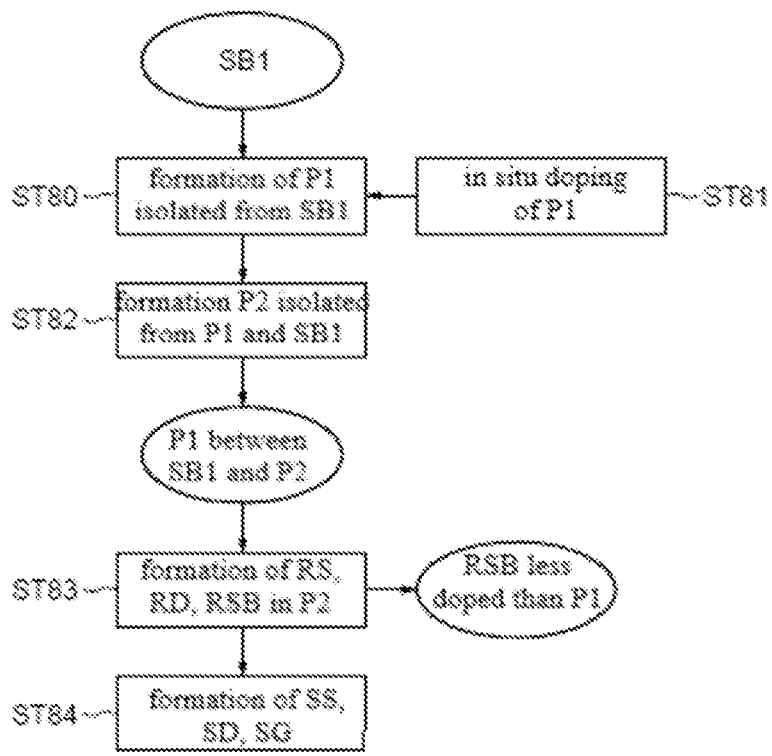
FIG. 8 is a flow diagram for a method of making.
Figure 13:
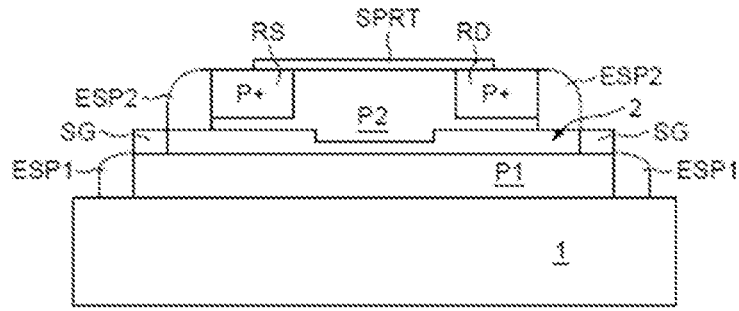
Figure 14:
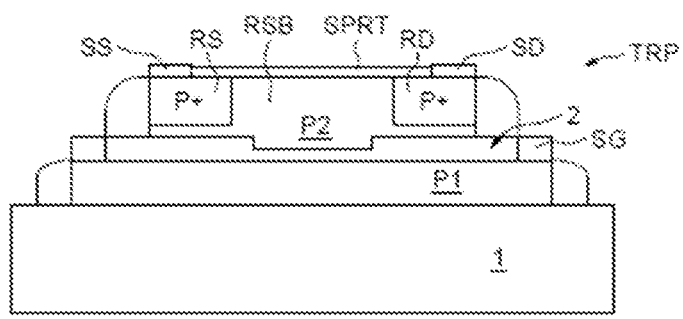
Figure 15:
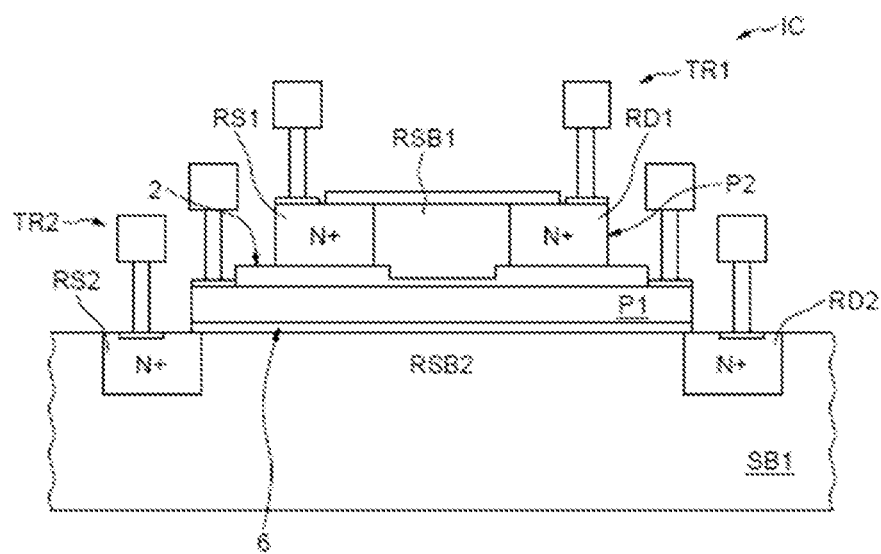
FIG. 15 illustrates a cross-sectional view of a transistor embodiment.

For simplification purposes in FIGS. 1 to 7, this protective layer is not shown in these figures, but will be referred to in the description of FIG. 8 and will be shown in FIGS. 13 to 15.

Reference is now made more particularly to FIG. 8 to describe one implementation of a method for manufacturing a first MOS transistor.

In the substrate SB1, the first polysilicon region P1 isolated from the first substrate SB1 is formed (step ST80).

By way of example, after the shallow trench type isolation trench 1 has been produced in a conventional manner, the formation of the first polysilicon region P1 can comprise depositing polysilicon followed by etching (in the case, for example, of the embodiments shown in FIGS. 1 to 5), or depositing in a deep trench followed by chemical-mechanical polishing (in the case, for example, of the embodiment shown in FIGS. 6 and 7). In this respect, more specifically, after having produced the shallow trench 1, a deep engraving is carried out through this trench 1 in order to produce the deep trench, followed by an oxidation of this deep trench. A layer of polysilicon is then deposited to fill the trench and the excess polysilicon is removed, for example by chemical-mechanical polishing.

Optionally, in situ doping ST81 of the first polysilicon region can be provided if a step similar to that of a conventional CMOS manufacturing method is used.

Then, in step ST82, the second polysilicon region P2 isolated from the first polysilicon region P1 and from the first substrate SB1 is formed.

For information, this formation can firstly comprise forming a dielectric region (for example a silicon oxide growth)

on the polysilicon region formed in step ST80, then depositing a second polysilicon level followed by etching, or in the case of a first buried polysilicon region, depositing a polysilicon level on the isolation trench followed by etching, to form the second polysilicon region P2.

At this stage, the first polysilicon region P1 is obtained between an area of the first substrate SB1 and the second polysilicon region P2.

Then, in step ST83, the source RS and drain RD regions are formed in a conventional manner known per se, with the substrate region RSB being located between the source and drain regions and being less heavily doped than the first polysilicon region P1.

Optionally, localized doping of this substrate region RSB can be carried out in order to adjust the threshold voltage of the transistor.

Then, in step ST84, the silicided areas SS, SB and SG are formed in a conventional and known manner after having protected the non-silicided areas with the protective layer mentioned hereinabove.

Reference is now made more particularly to FIGS. 9 to 14, which show in more detail one implementation of a method for producing a transistor such as that described in FIG. 1.

Figure 9:
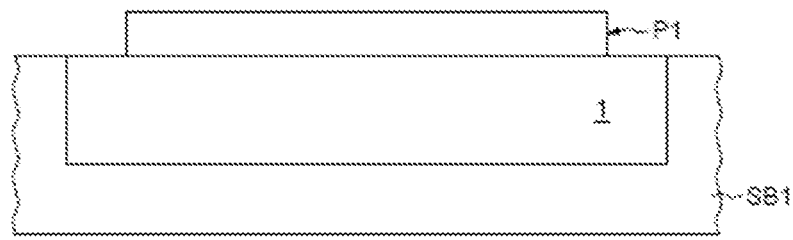
FIGS. 9-14 show steps in a method of making.

In FIG. 9, after having produced the isolation trench 1 in the first substrate SB1 of the integrated circuit in a conventional and known manner, the first polysilicon region P1 is formed by polysilicon deposition and then etching.

The formation of this first polysilicon region can, for example, be carried out simultaneously with the formation of the floating gate of a dual-gate state transistor of a non-volatile memory cell.

In FIGS. 10 to 14, for simplification purposes, the first substrate SB1 is no longer shown.

Figure 10:
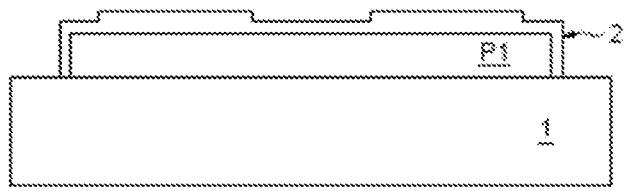

Then, as shown in FIG. 10, the first polysilicon region P1 is covered with the first dielectric region 2 including a silicon oxide growth and a deposition of a silicon oxide-silicon nitride-silicon oxide stack. In practice, the silicon oxide-silicon nitride-silicon oxide stack is firstly deposited and then the area in which the silicon oxide growth will take place is masked. The stack is removed in this area and then the silicon oxide growth is carried out in this area.

Figure 11:
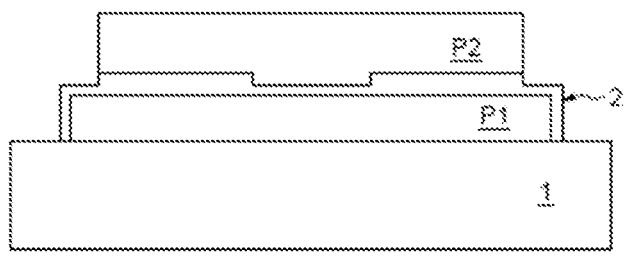

Then, as shown in FIG. 11, the second polysilicon region P2 which rests on a part of the dielectric region 2 is formed by depositing a second polysilicon level and then etching.

The formation of this second polysilicon region can, for example, be carried out simultaneously with the formation of the gate of a low-voltage transistor of a memory circuitry for example, i.e., a transistor capable of withstanding a gate-source voltage of, for example, less than or equal to 3 volts.

Figure 12:
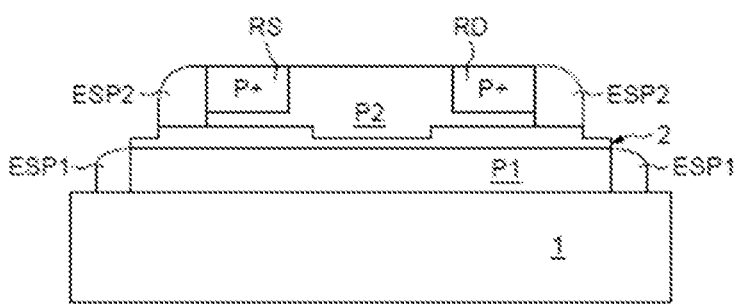

In FIG. 12, the lateral isolating regions or spacers ESP1 on the flanks of the first region P1 and the spacers ESP2 on the flanks of the second region P2 are produced in a conventional and known manner.

The second polysilicon region P2 is then locally implanted to form the source RS and drain RD regions.

The above-mentioned protective layer SPRT is then deposited (FIG. 13) on the top surface of the second polysilicon region P2 to protect the underlying part of the second polysilicon region P2 during the silicidation step described in FIG. 14.

More specifically, during this silicidation step, the silicided areas SS, SG and SD are produced in a conventional and known manner.

Reference is now made more particularly to FIG. 15, which shows an example embodiment of two transistors TR1 and TR2.

The first transistor TR1 is a transistor with a structure similar to that described with reference to FIGS. 1 and 2.

In this example, the first transistor TR1 is an NMOS transistor, but it goes without saying that the transistor TR1 could also be a PMOS transistor with P+ doping of the source RS1 and drain RD1 regions.

In FIG. 15, the layer protecting against silicidation and covering the substrate region RSB1 of the transistor TR1 is also shown, as well as part of the source RS1 and drain RD1 regions.

The first polysilicon region P1 of the first transistor TR1 rests on the first substrate SB1 of the integrated circuit IC via a dielectric layer 6, for example a gate oxide.

Moreover, the integrated circuit IC thus includes a second transistor TR2, in this case an NMOS transistor.

This second transistor TR2 includes, in the first substrate SB1, a source region RS2, a drain region RD2 and a substrate region RSB2 between the source and drain regions, this substrate region RSB2 being covered by the dielectric layer 2.

Moreover, the first polysilicon region P1 includes a gate region common to the first transistor TR1 and to the second transistor TR2.

It goes without saying that the second transistor TR2 could be a PMOS transistor if the source RS2 and drain RD2 regions were P+ doped.

It can thus be seen that if one of the two transistors is an NMOS transistor and the other is a PMOS transistor, then two complementary transistors with a compact structure are obtained.

Figure 16:
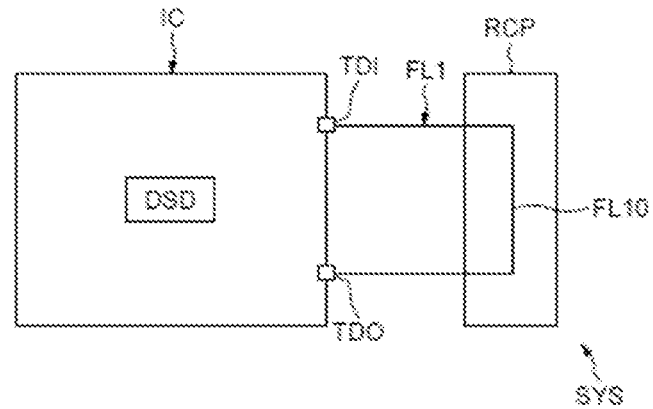
FIGS. 16-18 show use in a package opening detection implementation.

Reference is now made more particularly to FIG. 16 and the following, which diagrammatically show embodiments and implementations of a system SYS for detecting an opening or attempted opening of a closed container.

In FIG. 16, the system SYS includes a closed container RCP and an integrated circuit having a first terminal TD1 and a second terminal TD0 connected by an electrically conductive wire FL1.

This wire has a severable part FL10 and is arranged to be severed at the severable part thereof in the case of opening or attempted opening of the container RCP.

The system SYS further includes a detection device DSD, incorporated, in this case, within the integrated circuit IC, and configured to detect a present or past severing of the severable part FL10 of the wire FL1.

Figure 17:
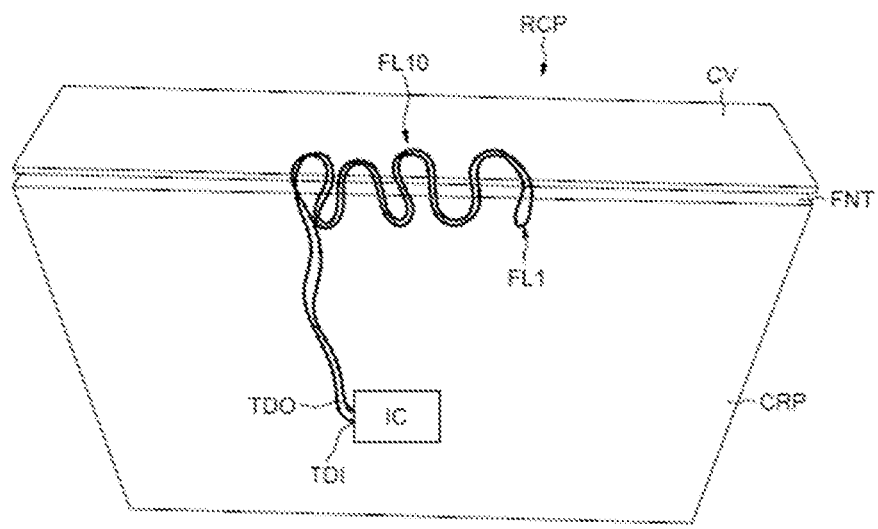

As shown in FIG. 17, the container RCP can be a case including a body CRP closed by a lid CV that creates a slot FNT with the body CRP.

It goes without saying that this is only one example and the container RCP can take any shape that is appropriate to the contents of the container. The container can be, for example, a bottle of wine or alcohol closed by a cork.

In the example shown in FIG. 17, the electrically conductive wire FL1, surrounded by an isolating cover, coils so as to extend alternately over the lid CV and over the body CRP.

This coil-shaped part FL10 forms the severable part of the electrically conductive wire.

More specifically, when the lid CV is opened, the wire FL1 will be severed at the severable part FL10.

It goes without saying that the drawing in FIG. 17 is not to scale and that a person skilled in the art will know how to choose the appropriate diameter for the wire FL1 so as to ensure that it is severed when the lid CV is opened.

The integrated circuit IC is, for example, attached to a wall of the body CRP.

Figure 18:
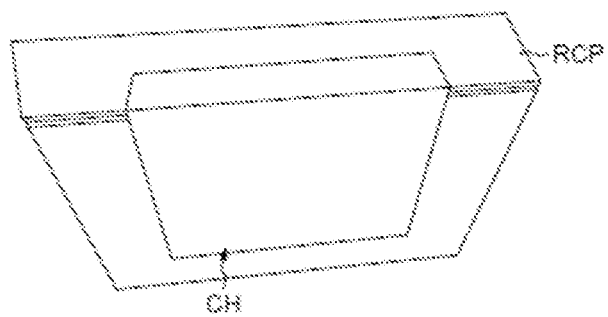

Then, once this assembly has been produced, the unit is covered with a cover CH as shown in a very diagrammatic manner in FIG. 18.

Figure 19:
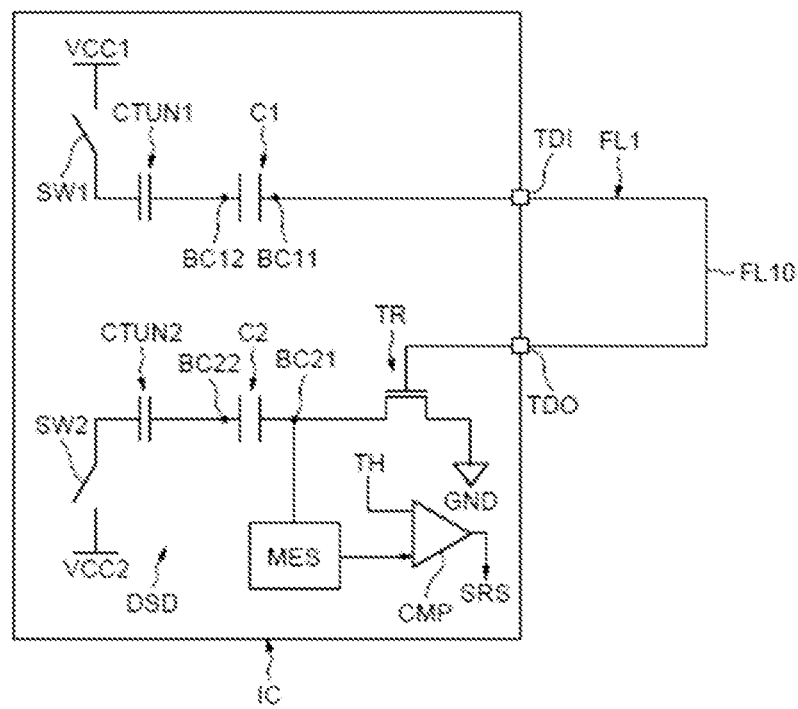
FIG. 19 is a circuit diagram for a package opening detection circuit.

Reference is now made more particularly to FIG. 19, which shows one example embodiment of a detection device DSD.

The device DSD in this case includes a first capacitor C1, electrically isolated from the first substrate SB1 of the integrated circuit and having a first electrode BC11 connected to the first terminal TDI of the integrated circuit.

In this example embodiment, the second electrode BC12 of the first capacitor C1 is connected to a supply voltage VCC1 via a first auxiliary capacitor CTUN1 and a first controllable switch SW1.

The device DSD further includes a first MOS transistor TR whose source and drain regions are electrically isolated from the first substrate SB1 and whose gate region is connected to the second terminal TD0 of the integrated circuit.

Generally speaking, the first transistor TR is configured to be in an on state when a zero voltage is applied to the gate thereof and in an off state when a non-zero bias is applied to the gate region thereof.

By way of example, in a non-limiting manner, the first transistor TR can be a PMOS transistor as described with reference to FIG. 1 and FIGS. 3 to 7.

Figure 21:
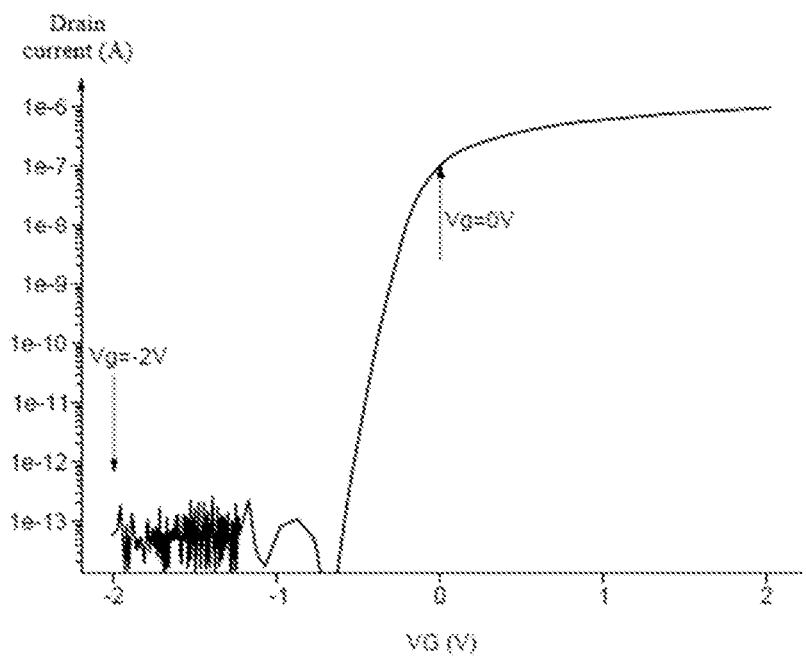
FIG. 21 illustrates a relationship between current and voltage.

In such a case, the first PMOS transistor TR has, for example, its source connected to the ground GND and is configured to, as shown in FIG. 21, be off in the presence of a negative bias Vg (for example −2 volts) applied to the gate thereof, and on in the presence of a zero voltage Vg applied to the gate thereof.

The first transistor TR is thus "normally on".

In order to obtain such a configuration, the threshold voltage of this first PMOS transistor TR is negative and for example in the order of −600 to −700 mV.

The device DSD further includes a second capacitor C2 electrically isolated from the first substrate SB1 of the integrated circuit.

This second capacitor C2 has a first electrode BC21 connected to the drain of the first transistor TR.

The second capacitor C2 has a second electrode BC22 connected to a supply voltage VCC2 via a second auxiliary capacitor CTUN2 and a second controllable switch SW2.

The detection device DSD further includes a measuring circuit MES configured to measure the voltage of the first electrode BC21.

As will be seen in more detail hereinbelow, a voltage of the first electrode below a threshold TH is representative of a present or past severing of the severable part FL10 of the wire FL1.

In this respect, in this embodiment, the integrated circuit IC includes a comparison circuit CMP configured to compare the voltage of the first electrode output by the measuring circuit IVIES with the threshold TH and to output a signal SRS representative of the result of the comparison.

This signal SRS can be a signal having a high state when the measured voltage is below the threshold TH and a low state when the measured voltage is above the threshold TH.

It goes without saying that the reverse is possible.

Figure 20:
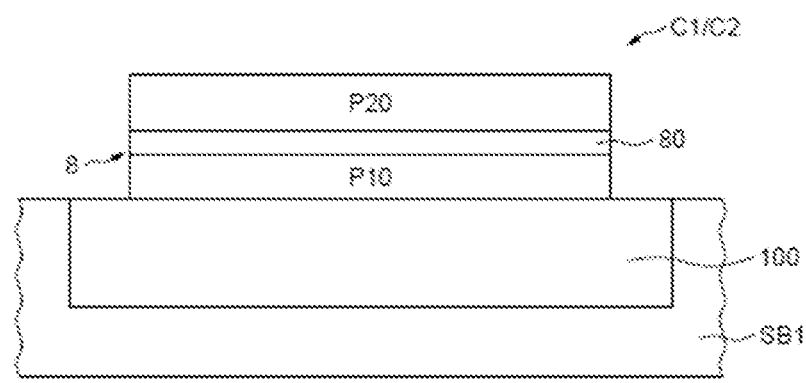
FIG. 20 illustrates a cross-sectional view of a capacitor for the circuit of FIG. 19.

One example embodiment that procures capacitors C1/C2 electrically isolated from the first substrate SB1 is diagrammatically shown in FIG. 20.

It can be seen in FIG. 20 that the first capacitor C1 and the second capacitor C2 are capacitors including two polysilicon electrodes P10 and P20, separated by a dielectric 8 including, for example, a stack 80 of the silicon oxide-silicon nitride-silicon oxide type.

These capacitors rest on an isolation trench 100, for example of the shallow trench type, made in the first substrate SB1.

Before going into detail regarding the operation of the system SYS, it should be noted here that, as stated hereinabove, a PMOS transistor TRP such as that described with reference to FIG. 1 and FIGS. 3 to 7 is not the only possible transistor that can be used.

More specifically, any transistor whose source and drain regions are electrically isolated from the first substrate and configured to be in an on state in the presence of a zero voltage applied to the gate thereof and in an off state in the presence of a non-zero bias of the gate region thereof, is suitable.

Figure 22:
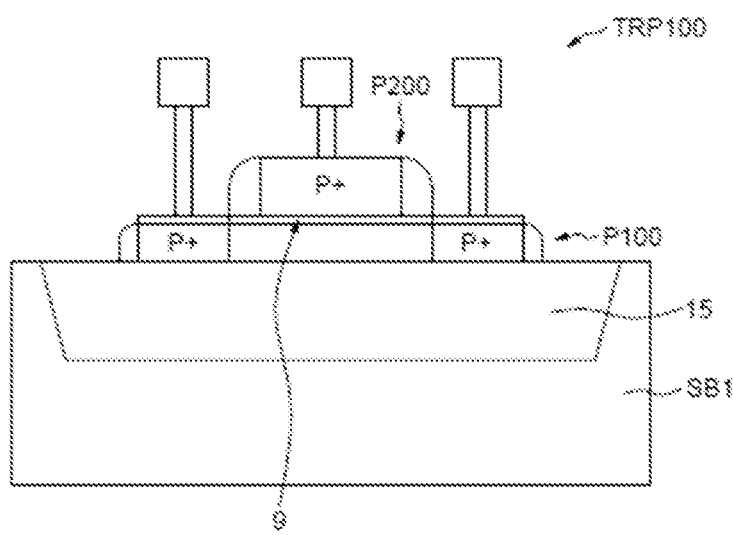
FIG. 22 illustrates a cross-sectional view of a transistor embodiment.

This can be, for example, the case of a transistor TRP100 such that that shown in FIG. 22.

This transistor TRP100 is also a double-polysilicon PMOS transistor, the first polysilicon region P100 whereof rests on an isolation trench 15 of the shallow trench type and the second polysilicon region P200 whereof rests on the first polysilicon region P100 via a gate oxide 9.

However, unlike the transistor TRP in FIG. 1 for example, the gate region of this transistor TRP100 is located in the second polysilicon region and the source and drain regions thereof are located in the first polysilicon region.

Compared to such a transistor TRP100, a transistor TRP such as that described with reference to FIG. 1 and FIGS. 3 to 7 is more advantageous since it has fewer leakages between the source and drain regions since they are disposed in the second polysilicon region, the substrate region whereof is either made of intrinsic polysilicon or lightly doped.

In the case whereby the substrate is a silicon-on-insulator (SOI) substrate including a carrier substrate positioned underneath a buried isolating layer known by a person skilled in the art as a BOX (Buried OXide), itself positioned underneath a semiconductor film, an MOS transistor can also be disposed in and on the semiconductor film. This would thus be electrically isolated from the carrier substrate of the integrated circuit via the BOX layer.

It goes without saying that, while it is generally easier to provide a PMOS transistor as the transistor TR, the use of an NMOS transistor is not ruled out.

Figure 23:
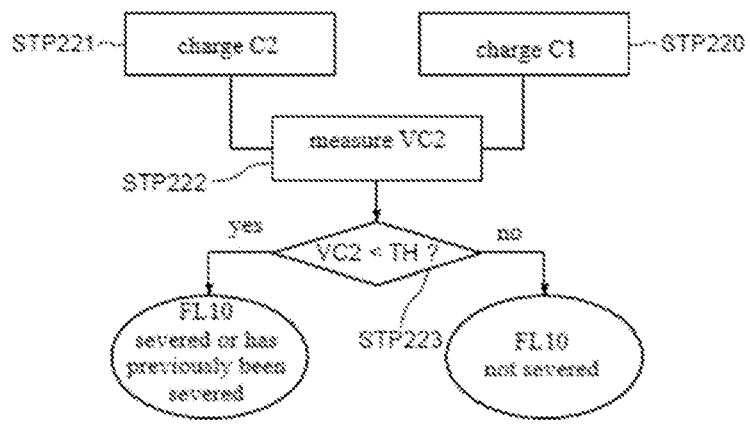
FIGS. 23-24 are flow diagrams for a method of detecting.

Reference is now made more particularly to FIG. 23 to describe the operation of the system SYS.

In a step STP 220, the first capacitor C1 is charged.

This charging is carried out by closing the switch SW1 in order to connect the first auxiliary capacitor CTUN1 to the supply voltage VCC1.

One role of the first auxiliary capacitor CTUN1 is to allow charges to be injected into the first capacitor C1 by the Fowler-Nordheim effect or by a hot-electron injection phenomenon.

The thickness of the dielectric layer of the first auxiliary capacitor CTUN1, for example 65-95 angstroms, is advantageously less than that of the first capacitor C1 to allow the capacitive structure to be programmed without using a too high voltage.

The dielectric layer of the first capacitor C1, which is thick because it uses a silicon oxide-silicon nitride-silicon oxide (ONO) stack, procures a capacitive structure that is well isolated from the first substrate SB1. Such a thickness, for example 150-200 angstroms, procures a very long charge retention, typically in the order of two decades, and prevents the risk of leakage on the first auxiliary capacitor CTUN1.

The first capacitor C1, once charged, thus has, at the first electrode BC11 thereof, a voltage that is, for example, negative and equal to −2 volts.

In step STP221, the second capacitor C2 is charged, this time by connecting the second auxiliary capacitor CTUN2 to the supply voltage VCC2 via the closed first switch SW2.

The function of the second auxiliary capacitor CTUN2 is similar to that of the first capacitor CTUN1.

Once charged, the voltage VC2 of the first electrode BC21 of the second capacitor C2 is, for example, a positive voltage equal to 2 volts.

This voltage VC2 is measured in step STP222 by the measuring circuit MES.

In this respect, the measuring circuit IVIES can be, for example, an MOS transistor, the gate whereof is connected to the electrode BC21, the source whereof is connected to the ground, and the drain whereof is connected to a current source allowing for a current-to-voltage conversion of the drain current of this transistor.

The node BC21 is thus not connected to the first substrate SB1, and to prevent gate leakages as much as possible, a high-voltage MOS transistor having, for example, a gate oxide in the order of 200 angstroms, will preferably be used.

If the severable part FL10 of the wire FL1 is not severed, then the transistor TR is off since the gate voltage thereof is equal to −2 volts.

As a result, the second capacitor remains charged and if a threshold TH equal to 1 volt for example is chosen, the comparison made in step STP223 shows that this voltage VC2 is higher than the threshold TH, which means that the severable part FL10 is not severed.

However, if the part FL10 of the wire is severed, then the gate voltage of the transistor TR is zero, which switches this transistor TR on and thus connects the electrode BC21 to the ground GND.

This results in a discharging of the second capacitor C2 and consequently in a drop in the voltage VC2.

This then falls below the threshold TH, which is representative of a severing of the severable part FL10.

It should be noted that a voltage VC2 below the threshold TH is also representative of a past severing of the severable part FL10 followed by a repair, for example by a welding spot, of this severable part.

More specifically, as soon as the wire has been severed, the gate voltage of the transistor becomes zero and the transistor is switched on, discharging the second capacitor C2 and causing the voltage VC2 to fall below the threshold TH.

Moreover, even if the wire is repaired, the capacitor C2 remains discharged.

Figure 24:
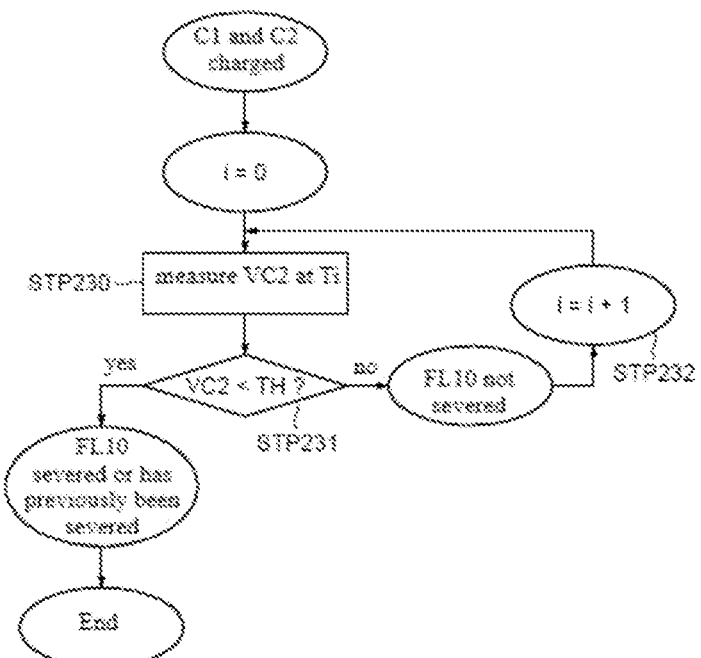

It is also possible, as shown diagrammatically in FIG. 24, to monitor the state of the severable part of the wire at regular or irregular time intervals.

More specifically, once the capacitors C1 and C2 have been charged, a first measurement of the voltage VC2 at the time T0 can be taken in step STP230. Then, in step STP231, the voltage VC2 is compared to the threshold.

If this voltage is below the threshold, this means that the severable part is severed or has previously been severed.

If the voltage VC2 is above the threshold, this means that the severable part FL10 has never been severed.

Moreover, steps STP230 and STP231 can then be repeated at distant measuring times Ti (represented by the incrementation of the index i in step STP232).

Moreover, a measured voltage that is below the threshold TH at a measuring time Ti thus indicates that the severable part of the wire is either severed at this measuring time or was severed prior to this measuring time.

Figure 25:
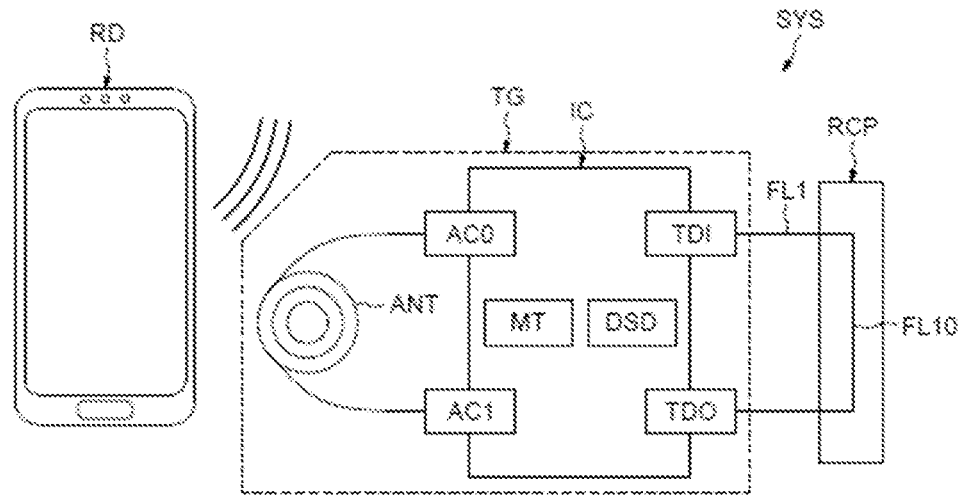
FIG. 25 is a block diagram of a near field communication implementation.

Use of a passive transponder in combination with a reader is particularly advantageous, as shown in FIG. 25, to detect the present or past severing of the wire FL1.

In this respect, in FIG. 25, the system SYS further includes a contactless passive transponder TG, for example a tag.

The passive transponder TG is configured to communicate with a reader RD, for example a cellular mobile phone having a contactless reader function, via an antenna ANT using a carrier signal with a frequency of 13.56 MHz for example.

The contactless passive transponder TG is, in this case, a transponder capable of communicating according to a contactless communication protocol using, for example, near field communication (NFC) technology.

This transponder can also be an RFID transponder using this NFC technology.

The transponder TG comprises the integrated circuit IC, which can be, for example, an integrated circuit of the family ST25 marketed by STMicroelectronics.

In addition to the two terminals TD1 and TD0 described hereinabove, the integrated circuit includes two antenna terminals AC0 and AC1 respectively connected to the two terminals of the antenna ANT.

The circuit IC further includes processing circuit MT, for example including an energy recovery circuit, a microprocessor and/or a wired logic and a memory.

The processing circuit are configured to output a supply voltage to the entire integrated circuit from the magnetic field received from the reader and to process the information received from the reader and retro-modulate the carrier signal for the transmission of information to the reader.

Figure 26:
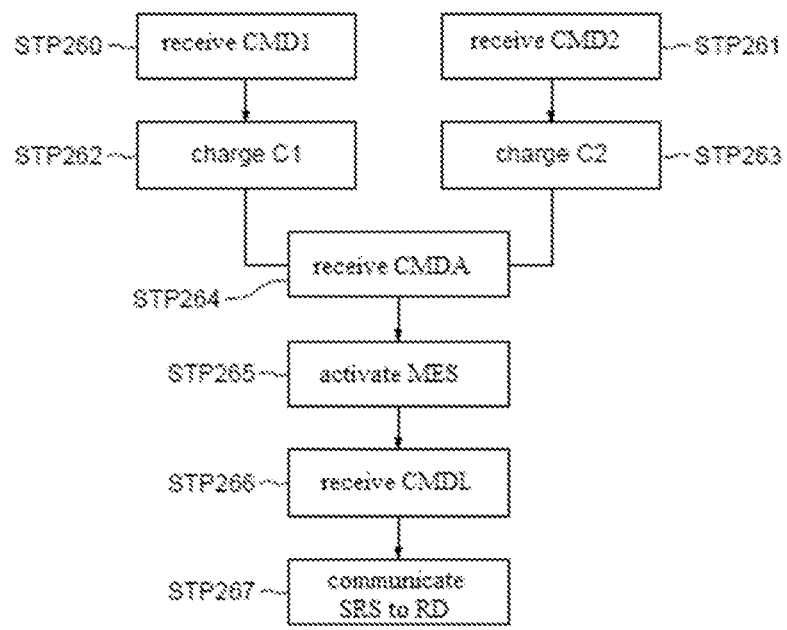
FIG. 26 is a flow diagram for operation.

More specifically, as shown in FIG. 26, the processing circuit MT are configured to: command (step STP262) a charging of the first capacitor C1 in response to a first command CMD1 originating (step STP260) from the reader; command (step STP263) a charging of the second capacitor C2 in response to a second command CMD2 originating (step STP261) from the reader; activate (step STP265) the measuring circuit in response to an activation command CMDA originating (step STP264) from the reader; and communicate (step STP267) the result SRS of said comparison to the reader RD in response to a read command originating (step STP266) from the reader.

The invention claimed is:

1. A system, comprising:
a closed container;
an integrated circuit having a first substrate and first and second terminals;
an electrically conductive wire connecting the first and second terminals and having a severable part that is arranged to be severed in the event of an opening or attempted opening of the closed container; and
a detection device configured to detect a severing of the severable part;
wherein the detection device includes, within the integrated circuit:
a first capacitor electrically isolated from the first substrate of the integrated circuit and connected to the first terminal;
a first MOS transistor having source and drain regions that are electrically isolated from the first substrate, and a gate region connected to the second terminal, wherein said first MOS transistor is configured to be in an on-state in response to a zero voltage applied to the gate region and in an off-state in response to a non-zero voltage applied to the gate region;
a second capacitor electrically isolated from the first substrate of the integrated circuit and having a first electrode connected to the drain region of the first MOS transistor; and
a measuring circuit configured to measure a voltage at said first electrode, wherein the voltage of said first electrode is indicative of a present or past severing of said severable part if said voltage is lower than a threshold.

2. The system according to claim 1, wherein the first MOS transistor comprises:
a first polysilicon region electrically isolated from the first substrate and including the gate region, a second polysilicon region electrically isolated from the first polysilicon region and from the first substrate, said second polysilicon region including the source region, a substrate region and the drain region of said first MOS transistor, wherein the first polysilicon region is located between an area of the first substrate and the second polysilicon region.

3. The system according to claim 2, wherein the substrate region of the second polysilicon region for the first MOS transistor is less heavily doped than the first polysilicon region.

4. The system according to claim 2, wherein the substrate region of the second polysilicon region for the first MOS transistor comprises one of: intrinsic polysilicon or doped polysilicon with a dopant concentration of less than $10^{17}$ atoms/cm$^3$.

5. The system according to claim 2, wherein the first polysilicon region has a dopant concentration of more than $10^{19}$ atoms/cm$^3$.

6. The system according to claim 2, wherein the first MOS transistor is a PMOS transistor.

7. The system according to claim 6, wherein the source region the first MOS transistor connected to ground and wherein the first MOS transistor has a threshold voltage such that it is in an on state in response to a zero voltage is applied to the gate region and in an off state in in response to a negative bias applied to the gate region.

8. The system according to claim 1, wherein each of the first capacitor and the second capacitor comprises two polysilicon electrodes separated by a dielectric and resting on an isolating region of the integrated circuit.

9. The system according to claim 1, further comprising:
a contactless passive transponder configured to communicate with a reader via an antenna by using a carrier signal, the contactless passive transponder including the integrated circuit having two antenna terminals connected to the antenna;
wherein the integrated circuit further includes a comparison circuit configured to compare the voltage of said first electrode with said threshold; and
a processing circuit configured to: command a charging of the first capacitor in response to a first command from the reader; command a charging of the second capacitor in response to a second command from the reader; activate the measuring circuit in response to an activation command from the reader; and communicate a result of said comparison in response to a read command from the reader.

10. A method for detecting whether a severable part of an electrically conductive wire connecting first and second terminals of an integrated circuit has been severed in the event of an opening or attempted opening of a closed container, comprising:
charging a first capacitor electrically isolated from a first substrate of the integrated circuit and connected to the first terminal;
charging a second capacitor electrically isolated from the first substrate of the integrated circuit and having a first electrode connected to a drain region of a first MOS transistor; and
using said first MOS transistor to take at least one measurement of a voltage of the first electrode of the second capacitor and compare the measured voltage to a threshold.

11. The method according to claim 10, wherein charging the first and second capacitors comprises charging only once, wherein using comprises taking a plurality of measurements of the voltage of the first electrode at distant measuring times comparing the plurality of measurements to said threshold, wherein a measured voltage that is below said threshold at one of said distant measuring times is indicative of the severable part having been severed at or before said one of said distant measuring times.

12. A system, comprising:
an integrated circuit, including:
a first substrate; and
a first MOS transistor having a first polysilicon region electrically isolated from the first substrate and including a gate region, a second polysilicon region electrically isolated from the first polysilicon region and from the first substrate, said second polysilicon region including a source region, a substrate region and a drain region of said first MOS transistor, wherein the first polysilicon region is located between an area of the first substrate and the second polysilicon region;
wherein the first MOS transistor is a PMOS transistor; and
wherein the source region the first MOS transistor connected to ground and wherein the first MOS transistor has a threshold voltage such that it is in an on state in response to a zero voltage is applied to the gate region and in an off state in in response to a negative bias applied to the gate region.

13. The system according to claim 12, wherein the substrate region of the second polysilicon region for the first MOS transistor is less heavily doped than the first polysilicon region.

14. The system according to claim 12, wherein the substrate region of the second polysilicon region for the first MOS transistor comprises one of: intrinsic polysilicon or doped polysilicon with a dopant concentration of less than $10^{17}$ atoms/cm$^3$.

15. The system according to claim 12, wherein the first polysilicon region has a dopant concentration of more than $10^{19}$ atoms/cm$^3$.

16. The system according to claim 12, wherein the integrated circuit further comprises an isolation trench located in the first substrate, and wherein the first polysilicon region is located above the isolation trench.

17. The system according to claim 16, wherein, in a source-drain direction of the first MOS transistor, the first polysilicon region extends beyond the second polysilicon region and wherein the second polysilicon region rests on the first polysilicon region via a first dielectric region.

18. The system according to claim 16, wherein:
the first polysilicon region extends beyond the second polysilicon region in a direction perpendicular to a source-drain direction of the first MOS transistor; and
in the source-drain direction of the first MOS transistor, a dimension of the second polysilicon region is greater than a dimension of the first polysilicon region and the second polysilicon region rests on the first polysilicon region and on the isolation trench via a second dielectric region.

19. The system according to claim 16, wherein:
the first polysilicon region extends beyond the second polysilicon region in a direction perpendicular to a source-drain direction of the first MOS transistor; and
in the source-drain direction of the first MOS transistor, a dimension of the second polysilicon region is greater than a dimension of the first polysilicon region, and the second polysilicon region rests on the first polysilicon region via a third dielectric region, and further rests on the isolation trench.

20. A system, comprising:
an integrated circuit, including:
a first substrate; and
a first MOS transistor having a first polysilicon region electrically isolated from the first substrate and including a gate region, a second polysilicon region electrically isolated from the first polysilicon region and from the first substrate, said second polysilicon region including a source region, a substrate region and a drain region of said first MOS transistor, wherein the first polysilicon region is located between an area of the first substrate and the second polysilicon region;
wherein the integrated circuit further comprises:
an isolation trench located in the first substrate; and
a dielectric layer surrounding the first polysilicon region, wherein the first polysilicon region is surrounded by the dielectric layer thereof extending through the isolation trench into the first substrate, and wherein the substrate region of the first MOS transistor rests at least partially on one end of the first polysilicon region surrounded by said dielectric layer and the source and drain regions resting on the isolation trench.

21. The system according to claim 20, wherein the integrated circuit further comprises at least one non-volatile memory cell of a type having a select transistor with a gate buried in the first substrate, and wherein the first polysilicon region has a shape like that of the gate of said select transistor.

22. A system, comprising:
an integrated circuit, including:
a first substrate; and
a first MOS transistor having a first polysilicon region electrically isolated from the first substrate and including a gate region, a second polysilicon region electrically isolated from the first polysilicon region and from the first substrate, said second polysilicon region including a source region, a substrate region and a drain region of said first MOS transistor, wherein the first polysilicon region is located between an area of the first substrate and the second polysilicon region;
wherein the integrated circuit further comprises:
a dielectric layer disposed between the first polysilicon region and the first substrate; and
a second MOS transistor including, in the first substrate, a source region, a drain region and a substrate region between the source and drain regions and covered by said dielectric layer, the first polysilicon region including a gate region common to the first MOS transistor and to the second MOS transistor.

23. The system according to claim 22, wherein the second MOS transistor is one of an NMOS transistor or a PMOS transistor.

* * * * *